United States Patent [19]

Salisbury

[11] Patent Number: 5,736,758

[45] Date of Patent: Apr. 7, 1998

[54] POST-FABRICATION REPAIR THIN FILM IMAGER STRUCTURE

[75] Inventor: Roger Stephen Salisbury, Schenectady, N.Y.

[73] Assignee: General Electric Company, Schenectady, N.Y.

[21] Appl. No.: 786,813

[22] Filed: Jan. 21, 1997

Related U.S. Application Data

[62] Division of Ser. No. 280,970, Jul. 7, 1994.

[51] Int. Cl.$^6$ .................................................. H01L 31/062
[52] U.S. Cl. .......................... 257/290; 257/291; 257/72; 257/59; 438/4
[58] Field of Search ............................ 257/443, 448, 257/459, 282, 291, 59, 72, 642, 290; 359/59, 82, 54, 57, 58, 60, 87, 88, 92, 93; 439/4

[56] References Cited

U.S. PATENT DOCUMENTS

| | | | |
|---|---|---|---|
| 4,688,896 | 8/1987 | Castleberry | 350/333 |
| 4,774,193 | 9/1988 | Juergens | 437/4 |
| 4,803,536 | 2/1989 | Tuan | 357/23.13 |
| 5,019,002 | 5/1991 | Holmberg | 445/24 |
| 5,055,416 | 10/1991 | Weber | 437/4 |
| 5,195,010 | 3/1993 | Dresner | 361/56 |
| 5,302,547 | 4/1994 | Wojnarowski et al. | 437/173 |
| 5,303,074 | 4/1994 | Salisbury | 359/59 |
| 5,313,319 | 5/1994 | Salisbury | 359/60 |
| 5,354,711 | 10/1994 | Heitzmann et al. | 437/182 |
| 5,475,246 | 12/1995 | Wei et al. | 257/291 |
| 5,480,812 | 1/1996 | Salisbury | 437/3 |
| 5,518,956 | 5/1996 | Liu et al. | 437/173 |

FOREIGN PATENT DOCUMENTS

| | | |
|---|---|---|
| 62-150847 | 7/1987 | Japan . |
| 1235252 | 9/1987 | Japan . |

OTHER PUBLICATIONS

W. L. Wright, "Electrostatic Discharge Protection of FET Gates With Thin Film Capacitors", IBM Technical Disclosure Bulletin, vol. 21, No. 6, Nov. 1978, pp. 2396–2397.

*Primary Examiner*—Carl W. Whitehead
*Attorney, Agent, or Firm*—Donald S. Ingraham

[57] ABSTRACT

A thin film electronic imager device has a repaired area between an upper conductive layer and an underlying component in the array in which portions of the upper conductive layer and a dielectric layer have been removed such that the upper conductive layer is electrically isolated from the underlying component. The repaired area has a bottom level having a surface comprising material of the underlying component and an intermediate step level having a surface comprising the dielectric layer material that extends around the periphery of the repaired area. The lateral dimension of the intermediate step level is greater than the lateral dimension of the bottom level such that the width of the intermediate level step surface is in the range between about 1 µm and 3 µm. Formation of the structure in the repair area is done by removing material by laser ablation to set back the upper conductive layer from the sidewall of the dielectric material in the region in which the defect was excised.

7 Claims, 2 Drawing Sheets

POST-FABRICATION REPAIR THIN FILM IMAGER STRUCTURE

This application is a division of application Ser. No. 08/280,970, filed Jul. 27, 1994.

BACKGROUND OF THE INVENTION

This invention relates generally to thin film electronic imager devices and more particularly to a low noise solid state radiation imager having repairable defects between an upper conductive layer disposed and underlying components in the imager array.

Solid state radiation imagers typically have a scintillator coupled to a photosensor imager array such that incident radiation of the type to be detected is absorbed in the scintillator, resulting in the generation of light, which in turn is detected by the photosensor array. The imager array typically comprises a number of components (such as photodiodes and switching transistors) which are coupled to address lines for conducting electrical signals to and from individual components in an imager device. A common electrode is disposed over the photosensor array to provide the common contact for each photosensor pixel in the array. The electrical signals generated by the photosensors correspond to the number of detected photons passing from the scintillator, and the signals from the respective photosensors are used to reproduce electronically an image corresponding to the photons detected by the array of photosensors.

A defect in the photosensor array can adversely affect overall performance of the thin film imager device. Common defects include electrical shorts between different components in the array, such as between the common electrode and underlying components (e.g., address lines or switching transistors), or between respective underlying components in the array (e.g., between a scan address line and a data address line). The components in the array are commonly formed in a series of steps in which layers of conductive, semiconductive, and insulative materials are deposited and these layers are patterned to form the desired components; unwanted conductive paths, or defects, can result from conductive debris left from the fabrication steps.

Given the expense of fabricating thin film electronic imager devices, it is desirable to have devices that are repairable. In particular, it is desirable to have a device that is repairable after deposition of the common electrode, that is, after the fabrication of the array, at which time tests can be run to check the electrical operation of the array. Any repairs made at this point typically require that the common electrode must be breached (that is, removed to gain access to underlying components that require repair). Particularly for medical imagers, in which noise is a critical factor, it is important that the repaired area not have significant residual electrical leakage that causes noise in the imager array. One problem with repairs of low noise imagers, however, is that repairs that involve breaking through the common electrode often result in leakage paths between the common electrode and underlying components that increase the noise in the array. This electrical leakage can result in noise of sufficient magnitude to degrade the performance of the array to the point where the array does not meet the specifications for use in a radiation imager.

It is accordingly an object of this invention to provide a method of repairing a thin film solid state imager device having an upper conductive layer (common electrode) that provides a low-electrical leakage repair area that does not adversely affect array noise characteristics.

Another object of this invention is to provide a repair method and repair structure that increases yield of fabrication.

A still further object of the present invention to provide an efficacious thin film solid state imager device low-leakage repair structure.

SUMMARY OF THE INVENTION

A thin film electronic imager device in accordance with this invention comprises an upper conductive layer disposed in a first level, an underlying component disposed in a second level, a dielectric material layer disposed between the upper conductive layer and the underlying component in an electrically-insulated region, and a repaired area in the electrically insulated region. In the repaired area, portions of the upper conductive layer and the dielectric layer have been removed such that the upper conductive layer is electrically isolated from the underlying component. The repaired area has a bottom level having a surface comprising material of the underlying component and an intermediate step level having a surface comprising the dielectric layer material that extends around the periphery of the repaired area. The lateral dimension of the intermediate step level is greater than the lateral dimension of the bottom level such that the width of the intermediate level step surface is in the range between about 1 µm and 3 µm. Typically the upper conductive layer is the common electrode of the imager array and comprises indium tin oxide or the like, and the dielectric material layer comprises polyimide.

A method of repairing a defect in a thin film electronic imager in accordance with this invention includes the steps of removing a first portion of the upper conductive layer at a repair site; removing a defect region in at least one underlying component so as to excise the defect; and removing a second portion of the upper conductive ctive layer around the periphery of the defect region so as to form an intermediate step at a level in the device below the upper conductive layer. The upper conductive layer is thus set back from the sidewall in the region in which the defect was excised, with the width of the intermediate step is between 1 µm and 3 µm. The steps of removing the portions of the upper conductive layer and removing the defect region typically include ablating the material to be removed with a laser. Following removal of the defect and formation of the intermediate level step, a passivation layer is typically deposited over the repair site.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
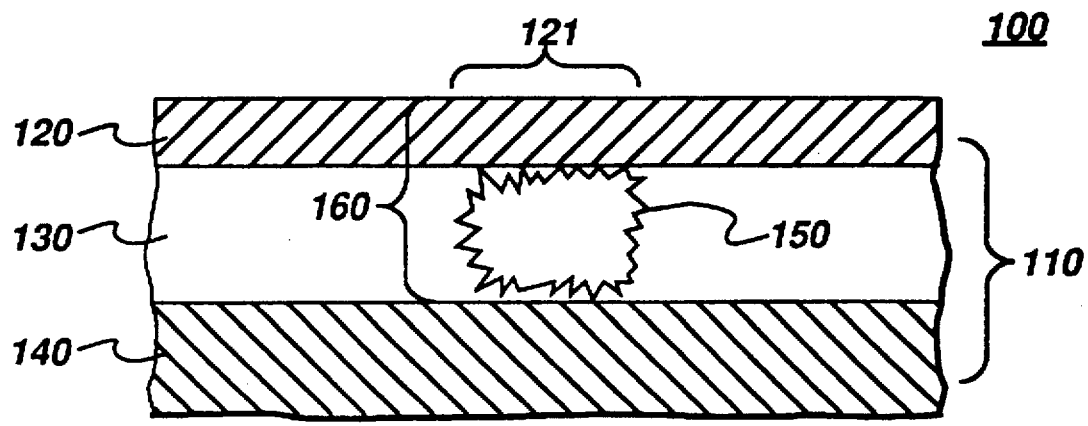
FIGS. 1(A)–1(D) are cross-sectional views illustrating steps in the repair of a defect in an imager device in accordance with this invention.
Figure 1B:
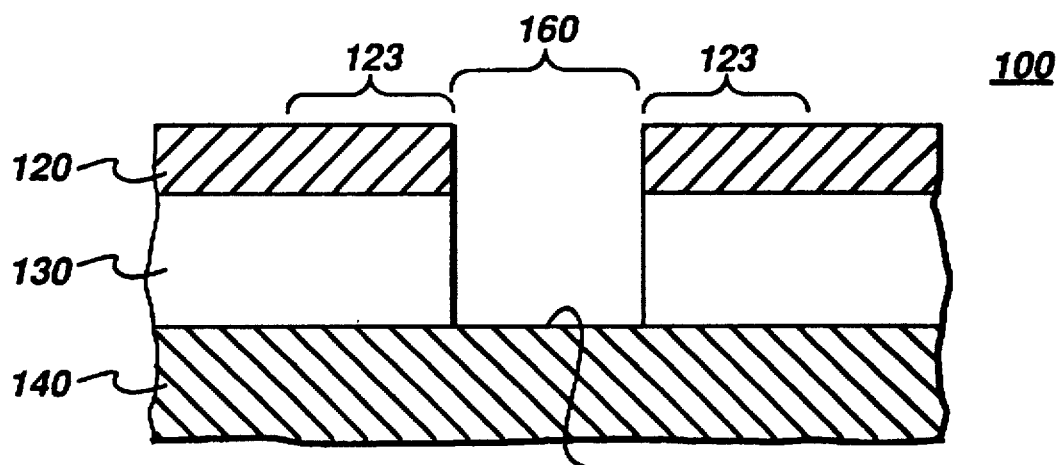
Figure 1C:
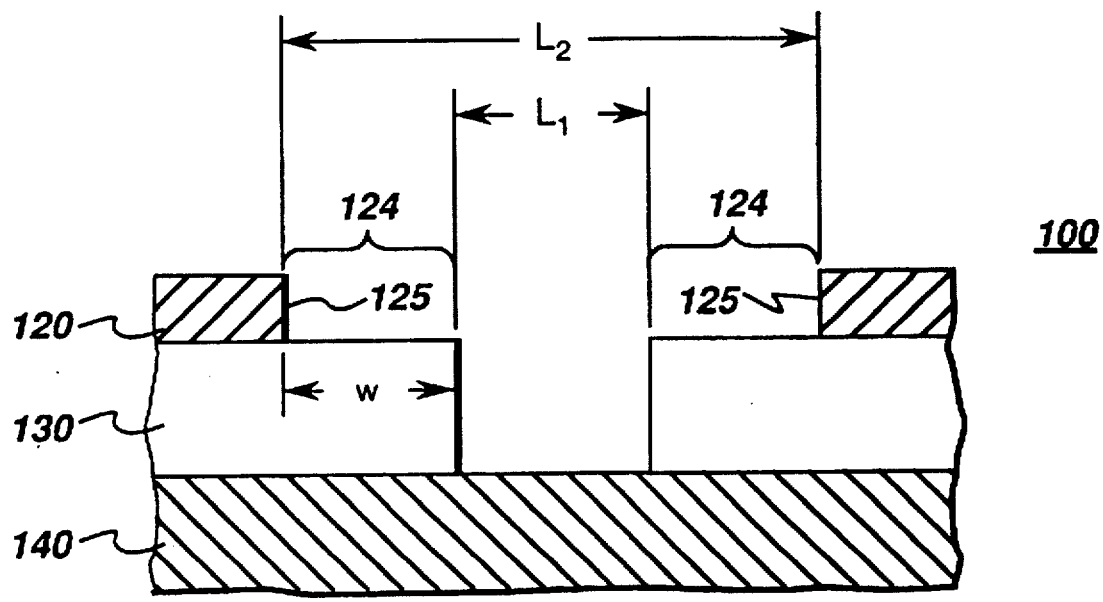
Figure 1D:
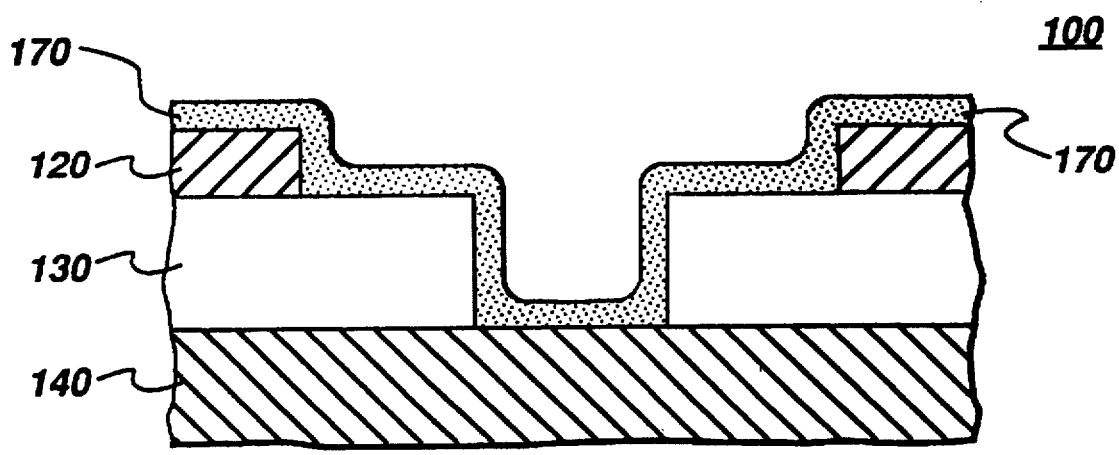

A partially-fabricated thin film electronic imager device 100, such as a solid state x-ray radiation imager, typically comprises a imaging array 110 (also referred to as a photosensor array), a pertinent portion of which is illustrated in FIG. 1. Array 110 comprises components (not individually shown) such as photodiodes, address lines, and switching devices (such as thin film transistors) that are arranged to generate an electrical signal in response to incident optical photons that pass from a scintillator (not shown) that is optically coupled to array 110 at a later stage in the fabrication process.

In array 110, an upper conductive layer 120 (also referred to as common electrode 120) is disposed over a dielectric material layer 130 that is in turn disposed to electrically insulate upper conductive layer 120 from an underlying component 140. Common electrode 120 provides a common contact to a plurality of photodiodes (not shown) or the like and thus is disposed over substantially the entire imaging array, overlying substantially every component in the imaging array. Common electrode comprises an electrically conductive material that is also light transmissive so as to allow optical photons to pass from the scintillator to the photosensors; typically the material is a transparent conducting oxide such as indium-tin oxide, gallium-tin oxide, tin oxide, or the like. Indium tin oxide and tin oxide, for example, can be deposited in a plasma sputtering process to a thickness in the range between 600 angstroms and 1400 angstroms to form common electrode 120.

Dielectric layer 130 typically comprises an organic dielectric such as polyimide or the like that is deposited in a spin process to a thickness in the range between 1 μm and 2 μm. Alternatively, dielectric layer 130 comprises an inorganic dielectric material such as silicon nitride or silicon oxide. Dielectric layer 130 extends across array 110 to form a region in which common electrode 120 is electrically insulated from underlying components in the array except at contact points on the photodiode, at which points dielectric layer material is removed so that the conductive material of common electrode 120 is disposed in electrical contact with a surface of the photodiode.

By way of example and not limitation, underlying component 140 illustrates a conductive material in the array, such as address line, a transistor electrode, or the like. As used herein, "underlying" refers to a component that is formed in the fabrication process prior to the deposition of the common electrode 120, and thus is disposed on a different level of the sandwich of materials that are deposited to fabricate the components for the imager device. No restriction on the orientation of the device is to be implied by the terminology relating to levels of the components. Underlying component 140 typically comprises a conductive material such as aluminum, gold, titanium, molybdenum or the like, or a heavily doped semiconductive material (such as n+type doped amorphous silicon). Alternatively, component 140 may comprise a layer of semiconductive material, such as the amorphous silicon comprising the photodiode body.

FIG. 1(A) illustrates imager device 100 at a stage in the fabrication process following deposition of the common electrode and prior to the mating of the scintillator to imaging array 110. At this point in the fabrication process final checks are made of imaging array 110 to locate electrical defects; arrays that are not repairable to maintain a satisfactory performance must be rejected. Electrical defects include electrical short circuits between underlying components in the array, such as between address lines, between address lines and switching transistors, or between the common electrode and underlying components. Open circuit conditions can also occur which require repair and removal of portions of the earlier-deposited components in the array. Each of these repair iterations, however, necessarily incur breaching common electrode 120 to remove a shorted portion of the common electrode or to gain access to defects in underlying components.

A defect 150 is shown in FIG. 1(A) that comprises a piece of conductive material debris that presents a short circuit between common electrode 120 and underlying component 140. The illustration of defect 150 is made by way of example and not limitation, and defect 150 is representative of any short circuit condition; further, if defect 150 (or any other type of defect requiring repair) is disposed between other underlying components, the same repair procedures are used to remove the portion of common electrode 120 overlying the defect and produce a low leakage repaired structure.

In accordance with the present invention, the short-circuit defect in imager array 110 is repaired by removing a first portion 121 of common electrode at a repair site (or defect region) 160 on imager array 110. Typically laser ablation is used to remove common electrode first portion 121. In particular, an excimer laser operated at low power provides a finely-focused beam that is very effective in ablating the conductive material of common electrode 120 without simultaneously ablating other components in the array or causing such a rapid vaporization of the transparent conducting oxide that results in conductive residue being driven into underlying dielectric layer 130. The low power used to remove common electrode first portion 121 is typically in the range between about 50 microJoules (μJ) and 60 μJ, which is about 15% of full power in a LCM 308 model excimer laser. Operation of the laser at lower power may necessitate several passes over repair site 160 to completely remove the conductive material of common electrode 120 in the repair area.

After removal of common electrode first portion 121, defect 150 and surrounding portions of dielectric layer 130 are then removed. Laser ablation is typically used to effect this removal, such as with an excimer laser operated at higher power than that used for removal of the common electrode material (e.g., at power levels in the range between 250 μJ and 350 μJ). Laser ablation typically allows fine resolution in removing material from the array (that is, the beam can be focused to an area of about 3 microns square so that the defect can be excised with minimal removal of material surrounding the defect region). Laser ablation also typically results in relatively smooth vertical sidewalls in repair site 160. At the conclusion of this first laser ablation step, the repair region of imager array 110 appears as illustrated in FIG. 1 (B). For the defect illustrated in the Figures, removal of the defect results in repair site 160 having a bottom surface 162 comprising the conductive material of underlying component 140.

Next, in accordance with this invention, a second portion 123 of common electrode 120 is removed to form an intermediate step level 124 (FIG. 1 (C)) around the periphery of repair site 160. The surface of intermediate level step 124 comprises the dielectric material of dielectric layer 130, that is, the conductive material of common electrode 120 is removed to expose the dielectric material. The lateral dimension $L_1$ of bottom surface 162 is less than the lateral dimension $L_2$ of the intermediate step level such that the width W of step 124 is greater than 1 μm, and typically is in the range between about 1 μm and 3 μm. Laser ablation, using the low power levels noted above, is used to remove common electrode second portion 123 to optimize the ablation while reducing the conductive material driven into underlying dielectric layer 130. The setback of common electrode sidewalls 125 from dielectric layer sidewalls 164 in repair site 160 serves to reduce possible paths for electrical leakage between common electrode 120 and underlying component 140. For many imager arrays (such as those used in medical imaging), it is desirable that leakage be less than 100 pA in order to minimize array noise. Data from repaired wafers indicate that for repairs conducted in the conventional manner, that is, without the set-back of the common electrode material around the repair site, only about one-half of the wafers exhibit leakage of 100 pA or less; for wafers repaired in accordance with this invention, about 95% of the wafers exhibit leakage of 100 pA or less. This reduction of leakage is critical in high resolution x-ray imagers used in medical applications, and can constitute the difference between acceptance or rejection of a repaired imaging array 110 for use in a radiation imaging device.

Following formation of intermediate level step 124, a passivation layer 170 is formed over the repaired area to enhance the long term low-leakage characteristics of repair site 160. Passivation layer 170 comprises a dielectric material such as, silicon nitride, silicon oxide, or the like, which is deposited in a plasma enhanced vapor deposition process to a thickness of about 1500 angstroms.

The procedure of this invention thus enables a completed imager array 110 to be repaired while maintaining low electrical leakage between common electrode 120 and underlying component 140. The procedure of this invention is applicable to any repair procedure requiring breaching common electrode 120 to gain access to underlying components (wherever such components are located in layers of the array), thereby allowing repair of an imaging array after final assembly, resulting in increased yields of devices from the fabrication process.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A thin film electronic imager device in which a defect affecting conductive components disposed in respective layers in the device has been repaired, the imager device comprising:

an upper conductive layer disposed in a first level and comprising a transparent conducting oxide material;

an underlying conductive component disposed in a second level;

a dielectric material layer disposed under said upper conductive layer between said underlying component in an electrically-insulated region underlying said upper conductive layer; and a repaired area in said electrically-insulated region of said device in which portions of said upper conductive layer and said dielectric material layer have been removed such that said upper conductive layer is electrically isolated from said underlying component in said repaired area, said repaired area having:

a bottom level having a surface comprising the underlying conductive component material, said bottom level having a first lateral dimension; and an intermediate step level having a surface comprising the dielectric layer material, said intermediate step level having a second lateral dimension, said second lateral dimension being greater than said first lateral dimension such that said upper conductive layer is set back from a sidewall extending between the intermediate step level surface and the bottom level surface.

2. The device of claim 1 wherein said intermediate step level extends around the periphery of said repaired area.

3. The device of claim 2 wherein the width of said intermediate step level surface is in the range between 1 µm and 3 µm.

4. The device of claim 1 wherein said sidewall extending between the intermediate step level surface and said bottom level surface comprises said dielectric material.

5. The device of claim 1 wherein said dielectric material layer comprises a material selected from the group consisting of polyimide, silicon nitride, and silicon nitride.

6. The device of claim 1 wherein said upper conductive layer comprises a material selected from the group consisting of indium-tin oxide, gallium-tin oxide, and tin oxide.

7. The device of claim 1 wherein said underlying component comprises an electrically conductive material.

* * * * *